US005144309A

United States Patent [19]
Adams et al.

[11] Patent Number: 5,144,309
[45] Date of Patent: Sep. 1, 1992

[54] ANALOG-TO-DIGITAL CONVERTER TO BE USED ALONG WITH A RESISTIVE SENSOR

[75] Inventors: John T. Adams, Minneapolis; T. Michael Tinsley, Coon Rapids; Phyllis L. Brown, Minneapolis, all of Minn.

[73] Assignee: Honeywell Inc., Minneapolis, Minn.

[21] Appl. No.: 651,688

[22] Filed: Feb. 6, 1991

[51] Int. Cl.⁵ .............................................. H03M 1/06
[52] U.S. Cl. ..................................... 341/155; 341/118
[58] Field of Search ............... 341/166, 155, 118, 119; 364/557; 340/584; 374/184, 185; 324/711, 721

[56] References Cited

U.S. PATENT DOCUMENTS 3,237,188  2/1966  Shair et al. .
3,281,828  10/1966 Kaneko .
3,493,963  2/1970  Shluter .
3,735,367  5/1973  Bennett, Jr. .
3,760,407  9/1973  Terry .
3,781,867  12/1973 Ellen et al. .
4,030,363  6/1977  Hallack .
4,291,297  9/1981  Kanemaru et al. .
4,841,458  6/1989  Levine et al. .

Primary Examiner—A. D. Pellinen
Assistant Examiner—B. K. Young
Attorney, Agent, or Firm—Ian D. MacKinnon; Craig J. Lervick

[57] ABSTRACT

An analog to digital converter used along with a variable resistive sensing means utilizes the capabilities of a microprocessor to charge and discharge a capacitor. The time required for this capacitor to discharge is dependent upon the value of the variable resistive sensing means. Circuitry is used to create a pulse whose pulse width is equal to the discharged time of a capacitor through the variable resistive sensing means.

14 Claims, 2 Drawing Sheets

ANALOG-TO-DIGITAL CONVERTER TO BE USED ALONG WITH A RESISTIVE SENSOR

FIELD OF THE INVENTION

The present invention involves circuitry to convert an analog signal to a digital format, thus allowing the signal to be used by a microprocessor and other digital equipment.

BACKGROUND OF THE INVENTION

Capacitors are normally charged and discharged through a resistor. The time required for the capacitor to charge or discharge is dependent upon the value of the related resistor. Therefore, if a capacitor is charged to a known level and subsequently allowed to discharge through a resistor, the resistance can be calculated by measuring the time required for the capacitor to discharge.

Modern microprocessors provide outputs that are capable of switching their voltage level from a high level to a low level. The high level is typically 5 volts dc and the low level is typically 0 volts dc. Microprocessor output can then be connected to circuitry that causes a capacitor to charge or discharge, depending on the state of the microprocessor output.

Subsequently, the microprocessor can determine a value relative to a variable resistive sensor. An example of this is shown in U.S. Pat. No. 4,841,758 to Levine et al.

SUMMARY OF THE INVENTION

An object of the present invention is to provide circuitry to be used along with a microprocessor that is capable of consistently measuring a value relative to a resistive sensor and converting it to a digital form. This object is accomplished by using circuitry that is simple, inexpensive and uses a small number of common parts.

An embodiment of this invention utilizes two terminals from a microprocessor. A first terminal is configured as an output, capable of switching its output voltage between approximately 0 volts dc and approximately 5 volts dc. This first terminal is used to control the charge and discharge sequences of a capacitor. A second terminal is configured as an input, capable of sensing the signal present at the terminal and deciphering between a digital high or low. The microprocessor can be utilized to calculate a value relative to the resistive sensor, when given the discharged time of the capacitor based on the theory of RC circuits.

Alternatively, the microprocessor can utilize the discharge time directly to execute further operations.

In addition to the microprocessor, circuitry is provided to create a pulse that starts upon the initiation of the capacitor discharge sequence and ends when the capacitor has discharged to a predetermined level. The second terminal of the microprocessor monitors this pulse, and measures its time duration. The time duration of this pulse is then used to calculate a value relative to the resistance of the resistive sensor.

To measure the value relative to the resistive sensor, the microprocessor initially holds its first terminal at a digital high for a period of time. This period must be long enough for the capacitor to charge to a steady state voltage, approximately equal to the output voltage of the microprocessor. Holding the first terminal high also causes a first transistor to turn on. The input of this first transistor is connected to a positive supply voltage through a resistor. The second terminal of the microprocessor is also connected to the collector of this transistor. When the first transistor is turned on the microprocessor sees a low voltage level at its second terminal.

Connected through a resistor to the input of the first transistor is the base of a second transistor. When the second transistor is on, it supplies current to the base of the first transistor in order to assure that it is on. The second transistor is connected between a power supply and the base of the first transistor.

To initiate the capacitor discharge the microprocessor's first terminal is switched low, causing the two transistors to turn off, and the microprocessor input to go high. The capacitor is then allowed to discharge exclusively through the resistive sensor. Once the capacitor has discharged to a predetermined level, the first transistor is switched on. This causes the second transistor to be switched on, resulting in a large amount of current being forced into the base of the first transistor. This additional current assures that the first transistor is fully switched on. By switching this first transistor on the voltage level at the microprocessor input is forced low, creating the falling edge of the measurement pulse.

An alternative embodiment is possible by removing the second switching means. This creates a circuit that performs the same function as the circuit of the first embodiment, but utilizes fewer parts and is less expensive.

In summary, the present invention creates a pulse with very sharp transitions which is used to measure the discharge time of the capacitor. Using this discharge time, the resistance value of the resistive sensor can be calculated. Alternatively, the microprocessor can use the discharge time alone to take further action, thus eliminating calculations that may be necessary.

As previously mentioned all of the parts are inexpensive and commonly available. The circuit creates results that are relatively consistent for a given device over a given period of time.

BRIEF DESCRIPTION OF THE DRAWING

A better understanding of the invention may be had by reading the following specification, in conjunction with the drawing, in which.

DESCRIPTION OF THE PREFERRED EMBODIMENT

Figure 1:
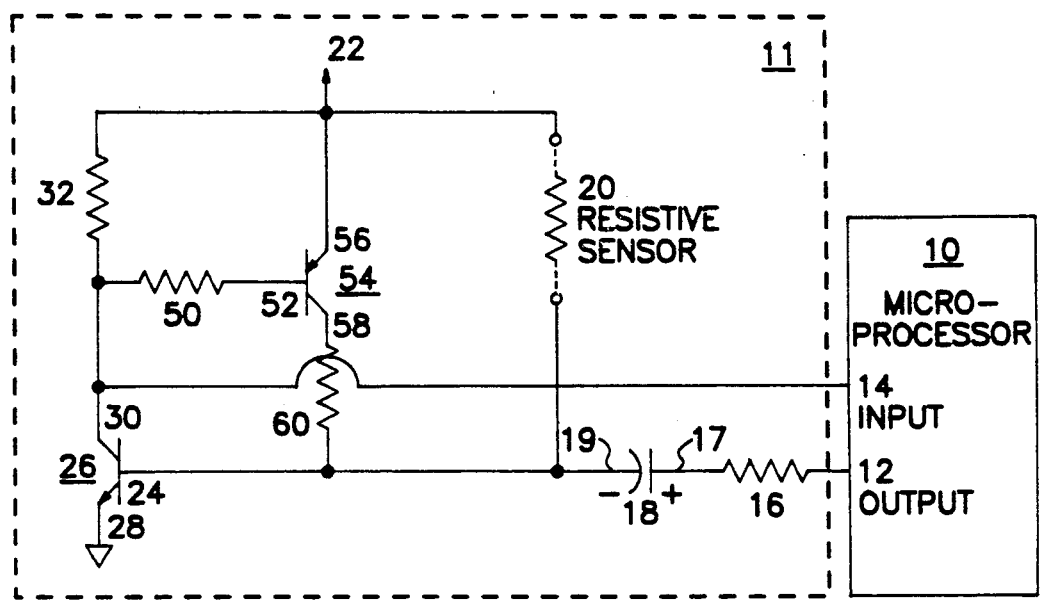
FIG. 1 is a schematic diagram of the preferred embodiment including a microprocessor.

Referring to FIG. 1, the present invention comprises microprocessor 10 and external circuit 11. External circuit 11 is used to create a pulse, having a pulse width indicative of the resistance value of a variable resistive sensing means 20 in this embodiment being a resistive sensor 20. The pulse is measured by the microprocessor 10 and subsequently used for whatever purposes are necessary.

One embodiment of the present invention uses two terminals of microprocessor 10; first terminal 12 is configured as an output and second terminal 14 is configured as an input.

First terminal 12 is capable of switching its output between a dc voltage approximately equal to the supply voltage, and zero volts (ground). Connected to first terminal 12 is first resistive means 16. Connected to the other side of first resistive means 16 is first side 17 of charge storage means 18 or anode 17 of capacitor 18. Capacitor 18 is charged and discharged in order to determine the resistance value of resistive sensor 20. The circuitry provides for resistive sensor 20 to be connected between positive supply voltage 22 and cathode 19 of capacitor 18. Thus, a series connection is created between positive voltage supply 22 and microprocessor first terminal 12 comprising, resistive sensor 20, capacitor 18 and first resistive means 16.

It will be understood by those skilled in the art that resistive sensor 20 could comprise any resistive means that alters its characteristics in response to some condition. For example, the sensor may include a temperature sensor, strain gauge, light sensors, humidity sensors, etc.

Connected to cathode 19 of capacitor 18 is first transistor or switching means 26. In the present embodiment, first transistor 26 is an npn bipolar junction transistor having base 24, collector 30, and emitter 28. Base 24 of first transistor 26 is connected to cathode 19 of capacitor 18. Emitter 28 of first transistor 26 is connected to ground while collector 30 is connected to positive power supply 22 through second resistive means 32.

First transistor 26 provides a switching function in the present circuit. Therefore, base 24, collector 30, and emitter 28 may be referred to as switch control 24, input 30, and output 28, respectively.

Also connected to collector 30 of first transistor 26 is second terminal 14 of the microprocessor 10. It is this point in the circuit where a pulse will be created having a duration equal to the discharge time of capacitor 18.

Further, connected to input 30 of first transistor 26 is third resistive means 50. Resistive means 50 having its other terminal connected to base 52 of second transistor 54. Second transistor 54 is a pnp bipolar junction transistor having base 52, collector 58, and emitter 56. Emitter 56 of second transistor 54 is connected to positive power supply 22 while collector 58 is connected to fourth resistive means 60.

As with first transistor 26, second transistor 54 also provides a switching function. Again, base 52, emitter 56 and collector 58, may be referred to as switch control 52, input 56, and output 58 respectively. Fourth resistive means 60 connected to output 58 of second transistor 54 has its other terminal connected to switch control 24 of first transistor 26.

Manipulation of microprocessor's first terminal 12 creates a pulse at microprocessor second terminal 14 that is indicative of the value of resistive sensor 20. The operational relationship between some of the points in the circuit can be seen by referring to FIG. 2. Initially the microprocessor first terminal 12 must be held high for a period of time. This causes capacitor 18 to charge to a voltage approximately equal to supply voltage 22 through first resistive means 16 and through base 24 emitter 28 junction of the first transistor 26. In this situation, first transistor 26 is held "on" causing second transistor 54 to be held "on" also. This causes the voltage level at microprocessor second terminal 14 to be approximately equal to ground. In the preferred embodiment, the supply voltage 22 is approximately 5 volt dc.

In order to measure the resistance of resistive sensor 20 microprocessor first terminal 12 must be forced low. When this is done, the voltage level at base 24 of first transistor 26 is forced negative, thus causing first transistor 26 to turn "off". With first transistor 26 turned "off", the voltage level at microprocessor second terminal 14 is forced high. This also causes second transistor 54 to turn "off" since the voltage at base 52 is approximately equal to the voltage at emitter 56. All of these related conditions are shown at time $t_1$, in FIG. 2.

With microprocessor first terminal 12 held approximately equal to ground capacitor 18 begins to discharge through resistive sensor 20. This is the voltage discharge that is being measured in order to calculate a value indicative of resistive sensor 20.

Figure 2:
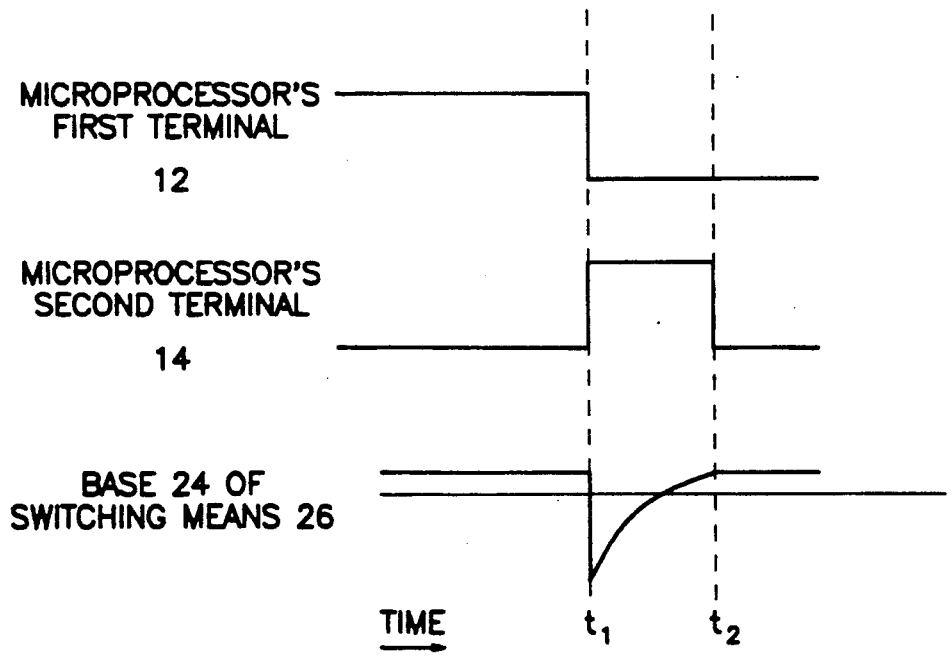
FIG. 2 is a timing diagram for the operation of the present invention.

Eventually the voltage at cathode 19 of capacitor 18 (also base 24 of first transistor 26) will cause first transistor 26 to turn "on". When this occurs the voltage at collector 30 of first transistor 26 will drop. As this happens, second transistor 54 is turned "on". This causes additional current to be forced into base 24 of first transistor 26. The switching of both transistors 26 and 54 creates a very sharp voltage transition from high to low at collector 30 of first transistor 26. Referring to FIG. 2, this transition occurs at time $t_2$. This is also the point where microprocessor second terminal 14 is connected. Thus, microprocessor 10 can measure the time duration of the pulse that is created, and calculate the resistance of resistive sensor 20 therefrom.

When microprocessor 10 senses a transition from low to high at second terminal 14, microprocessor 10 can begin to increment a counter. This counter is contained within microprocessor 10 and its speed is dependent upon the clock speed of the microprocessor 10. This counter continues to count until the microprocessor 10 senses a transition from high to low at second terminal 14. The value of this counter can then be used to calculate the resistance of resistive sensor 20 using the theory of an RC circuit. Further calculations can be made to convert this counter value to any unit so desired.

A second method to determine a value relative to the resistance value of variable resistance sensor means 20 involves storing clock signals. When the microprocessor 10 changes the state of first terminal 12, the value of an internal clock may be stored. Then, following capacitor 18 discharge, when a transition from high to low occurs on microprocessor's second terminal 14 the value of the same internal clock can be stored. By subtracting the two stored clock values, the discharge time can be determined.

In the present embodiment, microprocessor 10 is the HC68705P7 made by Motorola.

Figure 3:
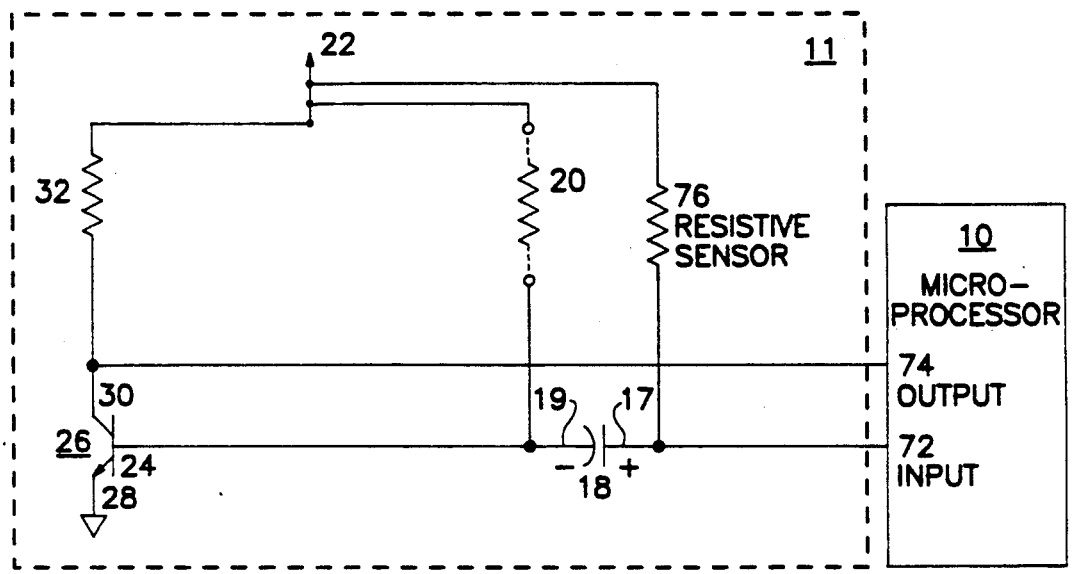
FIG. 3 is a schematic diagram of an alternate embodiment.

Referring to FIG. 3, a second embodiment of the present invention is shown. This circuit also causes capacitor 18 to charge and discharge in response to a changing microprocessor output.

Microprocessor 70 is shown having first terminal 72 and second terminal 74. First terminal 72 is capable of being configured as either an input or an output. Second terminal 74 need only be configured as an input. Connected to first terminal 72, resistor 76 and capacitor 18. The other side of resistor 76 is connected directly to dc power supply 22. Connected to the other side of capacitor 18 is base 24 of transistor 26 and one side of resistive sensor 20. The opposing side of resistive sensor 20 is connected to dc supply 22. Transistor 26 is connected in a similar manner as shown in FIG. 1, with collector 30 connected to dc voltage supply 22 through resistor 32.

Emitter 28 is further connected to ground. One major difference being that second transistor 54 of FIG. 1 is no longer present. Also connected to collector 30 of the transistor 26 is second terminal 74 of microprocessor 70.

In operation circuit 11 of FIG. 3 causes capacitor 18 to charge to a certain level and then discharge through resistive sensor 20. The time required for capacitor 18 to discharge through resistive sensor 20 is dependent upon the value of resistive sensor 20.

To cause the aforementioned charge and discharge, microprocessor's first terminal 72 is switched to its input state. In this state first terminal 72 has a very large input resistances and is effectively an open circuit. First terminal 72 in this configuration allows current to flow from dc voltage supply 22 through resistor 76, capacitor 18 and switching means 26 to ground. This causes capacitor 18 to charge to a level approximately equal to the voltage level at dc voltage supply 22. In order to measure the value of resistive sensor 20, first terminal 72 of microprocessor 70 is reconfigured to an output at a voltage level of 0 volts dc (ground). Capacitor 18 is charged to approximately 5 volts, which causes base 24 of transistor 26 to drop to a negative 5 volts dc. This causes switching means 26 to open and no longer conduct. In turn this causes second terminal 74 of microprocessor 70 to rise to approximately 5 volts DC. At this time capacitor 18 begins to discharge through resistive sensor 20 to positive voltage supply 22. When capacitor 18 has discharged and begin to charge in a positive direction to a point where the capacitor is charged to approximately 0.7 volts dc, transistor 26 is again switched on. This causes second terminal 74 of microprocessor 70 to go low.

When the voltage level on first terminal 72 of microprocessor 70 is converted from an input to an output level of 0 volts, the value of a counter within microprocessor 70 is stored. When the voltage level on second terminal 74 of microprocessor 70 drops from a high to a low, the value of a counter within microprocessor 70 is again stored. By subtracting these two counter times from one another, the discharge time of capacitor 18 can be determined.

Therefore, the present invention is capable of measuring the resistance of resistive sensor 20 and transforming that value to a more useful unit of measurement. Alternatively, the discharge time of capacitor 18 can be used to make further decisions or take further action. For example, this invention could be used in a thermostat to sense the temperature of a controlled space. This invention could also be used in conjunction with humidity sensors, light sensors, pressure sensors, and others.

What is claimed is:

1. An analog to digital converter adapted to be connected to a microprocessor for measuring a value representative of a resistance value of a variable resistive sensing means, said analog to digital converter comprising:
    variable resistive sensing means having its resistance dependent upon a condition being sensed, a first side of said variable resistive sensing means adapted to be connected to a voltage supply;
    charge storage means to be charged and discharged at varying rates proportional to said resistance value of said variable resistive sensing means, a first side of said charge storage means adapted to be connected to the microprocessor, a second side of said charge storage means connected to a second side of said variable resistance sensing means; and
    a first switching means having an input, an output, and a switch control, said switch control connected to said second side of said charge storage means, said input adapted to be connected to the voltage supply, and said output connected to a point of common potential, said input further adapted to be connected to the microprocessor, wherein said charge storage means is discharged through said variable resistive sensing means, causing said first switching means to change states when said charge storage means has discharged to a predetermined level, causing said input to change states which is communicated to the microprocessor.

2. The analog to digital converter of claim 1 wherein said charge storage means is a capacitor.

3. The analog to digital converter of claim 1 wherein said first switching means is a transistor having a base, emitter, and collector, said base being said switch control, said collector being said input, and said emitter being said output.

4. An analog to digital converter comprising:
    variable resistive sensing means having its resistance dependent upon a condition being sensed, a first side of said variable resistive sensing means adapted to be connected to a voltage supply;
    a microprocessor having at least one input and at least one output, said output capable of switching between a digital low and a digital high and, said input capable of monitoring a voltage level, said microprocessor further capable of determining time between voltage transitions on said input line;
    charge storage means to be charged and discharged at varying rates proportional to said resistance of said variable resistive sensing means, a first side of said charge storage means connected to said microprocessor, a second side of said charge storage means connected to a second side of said variable resistive sensing means; and
    a first switching means having an input, an output, and a switch control, said switch control connected to said second side of said charge storage means, said input adapted to be connected to the voltage supply, and said output connected to a point of common potential, said input further connected to said microprocessor input, wherein said charge storage means is discharged through said variable resistive sensing means, causing said first switching means to change states when said charge storage means has discharged to a predetermined level creating a voltage transition which is communicated to said input of said microprocessor.

5. The analog to digital converter of claim 4 wherein said first switching means is a transistor having a base, emitter, and collector, said base being said switch control, said collector being said input, and said emitter being said output.

6. The analog-to-digital converter of claim 4 wherein said charge storage means is a capacitor.

7. An analog to digital converter connected to a microprocessor for measuring a value representative of a resistance value of a variable resistive sensing means, said analog to digital converter comprising:
    variable resistive sensing means having its resistance dependent upon a condition being sensed, a first side of said variable resistive sensing means being adapted to be connected to a positive voltage supply;

charge storage means to be charged and discharged at varying rates proportional to said resistance value of said variable resistive sensing means, a first side of said charge storage means adapted to be connected to the microprocessor, a second side of said charge storage means connected to a second side of said variable resistance sensing means;

first switching means having an input, an output, and a switch control, said switch control connected to said second side of said charge storage means, said input adapted to be connected to the positive voltage supply, and said output connected to a point of common potential, said switch input further connected to the microprocessor; and second switching means having an input, an output, and a switch control, said switching control connected to said input of said first switching means, said input of said second switching means connected to the positive voltage supply, and said output connected to said switch control of said first switching means, wherein said charge storage means is discharged through said variable resistive sensing means, causing said first switching means to change states when said charge storage means has discharged to a predetermined level, further causing said second switch control to switch on, causing said input of said first switching means to change states which is communicated to the microprocessor.

8. The analog-to-digital converter of claim 6 wherein said charge storage means is a capacitor.

9. The analog-to-digital converter of claim 6 wherein said first switching means is a transistor having a base, emitter, and collector, said base being said switch control, said collector being said input, and said emitter being said output.

10. The analog-to-digital converter of claim 6 wherein said second switching means is a transistor having a base, emitter and collector said base being said switch control, said emitter being said input, and said collector being said output.

11. An analog to digital converter comprising:

variable resistive sensing means having its resistance dependent upon a condition being sensed, a first side of said variable resistive sensing means adapted to be connected to a voltage supply;

a microprocessor having at least one input and at least one output, said output capable of switching between a digital low and a digital high and, said input capable of monitoring a voltage level, said microprocessor further capable of determining the time between voltage transitions on said input line;

charge storage means to be charged and discharged at varying rates proportional to said resistance of said variable resistive sensing means, a first side of said charge storage means connected to said microprocessor, a second side of said charge storage means connected to a second side of said variable resistive sensing means;

a first switching means having an input, an output, and a switch control, said switch control connected to said second side of said charge storage means, said input adapted to be connected to the voltage supply, and said output connected to a point of common potential, said input further connected to said microprocessor input; and second switching means having an input, an output, and a switch control, said switch control connected to said input of said first switching means, said input of said second switching means connected to the voltage supply, and said output connected to said switch control of said first switching means, wherein said charge storage means is discharged through said variable resistive sensing means, causing said first switching means to change states when said charge storage means has discharged to a predetermined level, creating a signal which is communicated to said microprocessor.

12. The analog-to-digital converter of claim 7 wherein said charge storage means is a capacitor.

13. The analog-to-digital converter of claim 7 wherein said first switching means is a transistor having a base, emitter and collector said base being said switch control, said collector being said input and said emitter being said output.

14. The analog-to-digital converter of claim 7 wherein said second switching means is a transistor having a base, emitter, and collector, said base being said switch control, said emitter being said input and said collector being said output.

* * * * *